US009747490B2

(12) United States Patent
Quarles et al.

(10) Patent No.: US 9,747,490 B2
(45) Date of Patent: Aug. 29, 2017

(54) CELL SIZE IMAGING

(71) Applicant: VANDERBILT UNIVERSITY, Nashville, TN (US)

(72) Inventors: Christopher Chad Quarles, Nashville, TN (US); John C. Gore, Nashville, TN (US); Natenael B. Semmineh, Nashville, TN (US)

(73) Assignee: VANDERBILT UNIVERSITY, Nashville, TN (US)

( * ) Notice: Subject to any disclaimer, the term of this patent is extended or adjusted under 35 U.S.C. 154(b) by 0 days.

(21) Appl. No.: 14/932,386

(22) Filed: Nov. 4, 2015

(65) Prior Publication Data

US 2016/0125224 A1   May 5, 2016

(51) Int. Cl.
G06K 9/00 (2006.01)
G01R 33/50 (2006.01)
G01R 33/56 (2006.01)

(52) U.S. Cl.
CPC ......... *G06K 9/00127* (2013.01); *G01R 33/50* (2013.01); *G01R 33/5601* (2013.01)

(58) Field of Classification Search
CPC . G06K 9/00127; G01R 33/50; G01R 33/5601
USPC ...................................................... 382/133
See application file for complete search history.

(56) References Cited

U.S. PATENT DOCUMENTS

| 5,883,514 | A  | * | 3/1999  | Ishikawa ............ | G01R 33/5615 126/25 R |
| 8,886,283 | B1 | * | 11/2014 | Chen .................... | A61B 5/055 382/128 |
| 2008/0312540 | A1 | * | 12/2008 | Ntziachristos ..... | A61B 1/00009 600/478 |
| 2009/0154788 | A1 | * | 6/2009  | Maiya ................ | G06K 9/00127 382/133 |
| 2012/0262703 | A1 | * | 10/2012 | Zahniser ............ | G01N 15/1475 356/39 |
| 2013/0184557 | A1 | * | 7/2013  | Glaser-Seidnitzer | A61B 5/0013 600/407 |
| 2014/0029834 | A1 | * | 1/2014  | Chen .................. | G06K 9/00127 382/133 |
| 2014/0119633 | A1 | * | 5/2014  | McCord ............ | G01N 15/1463 382/133 |
| 2015/0269411 | A1 | * | 9/2015  | Lee .................... | G06K 9/00127 382/133 |

(Continued)

OTHER PUBLICATIONS

Tropres et al., entitled, "Vessel Size Imaging," Magnetic Resonance in Medicine, pp. 397-408, (2001).

(Continued)

*Primary Examiner* — John Strege
(74) *Attorney, Agent, or Firm* — Nixon Peabody LLP; Eduardo J. Quinones

(57) ABSTRACT

In the various embodiments, cell size imaging is performed using a method that relies upon the acquisition of gradient echo and spin echo data during contrast agent (CA) passage through tissue and estimation of "perturber" size using the ratio of $\Delta R_2^*$ and $\Delta R_2$. When measured at CA equilibrium, the magnetic field perturbations, and associated MRI signal changes, are determined by the cellular features and not the vasculature. Thus, in cell size imaging the cells act as the perturbers.

21 Claims, 7 Drawing Sheets

(56) References Cited

U.S. PATENT DOCUMENTS

2016/0025612 A1* 1/2016 Kuninori ............ G01N 15/1463 382/133

OTHER PUBLICATIONS

Pannetier et al., entitled, "Vessel Size Index Measurements in a Rat Model of Glioma: Comparison of the Dynamic (Gd) and Steady-State (iron-oxide) Susceptibility Contrast MRI Approaches," NMR in Biomedicine, pp. 218-226, (2012).
Quarles et al., entitled, "Assessment of the Morphological and Functional Effects of the Anti-Angiogenic Agent SU11657 on 9L Gliosarcoma Vasculature Using Dynamic Susceptibility Contrast MRI," Magnetic Resonance in Medicine, pp. 680-687, (2007).
Beaumont et al, entitled, "Characterization of Tumor Angiogenesis in Rat Brain Using Iron-Based Vessel Size Index MRI in Combination with Gadolinium-Based Dynamic Contrast-Enhanced MRI," Journal of Cerebral Blood Flow and Metabolism, pp. 1714-1726, (2009).
Donahue et al., entitled, "Utility of Simultaneously Acquired Gradient-Echo and Spin-Echo Cerebral Blood Volume and Morphology Maps in Brain Tumor Patients," Magnetic Resonance in Medicine, pp. 845-853 (2000).
Stables et al, entitled, "Asymmetric Spin-Echo Imaging of Magnetically Inhomogeneous Systems: Theory, Experiment, and Numerical Studies," Department of Diagnostic Radiology, and Department of Applied Physics, pp. 432-442 (1998).

* cited by examiner

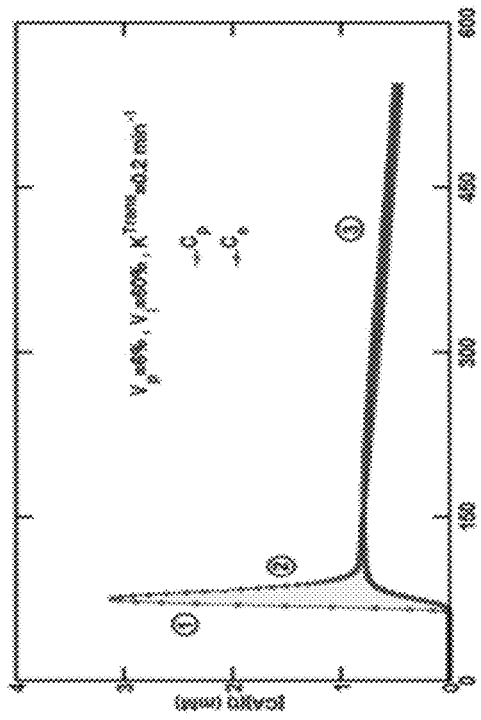
FIG. 2A
FIG. 2B
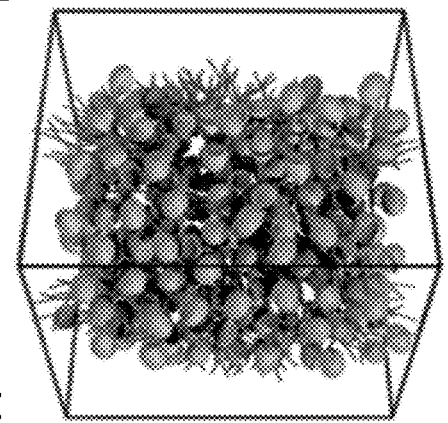
FIG. 2C
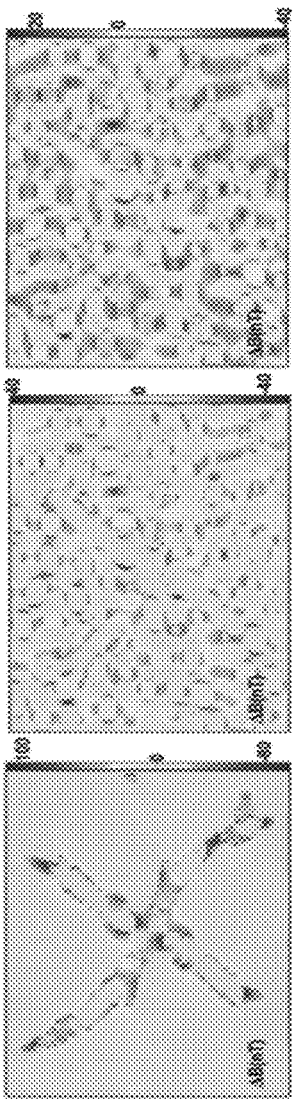
FIG. 2D
FIG. 2E
FIG. 2F

400

CELL SIZE IMAGING

GOVERNMENT LICENSE RIGHTS

This invention was made with government support under grant number NIH/NCI 1R01 CA158079-01 awarded by the National Institute of Health. The government has certain rights in the invention

CROSS-REFERENCE TO RELATED APPLICATIONS

This application claims priority to and the benefit of U.S. Provisional Patent Application No. 62/075,424, filed Nov. 5, 2014, the contents of which are hereby incorporated by reference in their entirety as if fully set forth herein.

FIELD OF THE INVENTION

The present invention relates to magnetic resonance imaging (MRI), and more specifically to apparatus and methods for cell size imaging using MRI systems.

BACKGROUND

Each organ in the human body is composed of highly specialized and uniquely shaped cells that serve specific biological roles. Cell volume regulatory mechanisms actively influence physiological systems and functions in an attempt to maintain homeostasis. Changes in cell size are known to alter, for example, metabolism, intracellular signaling pathways, cell cycle progression, nutrient uptake and gene expression. Furthermore, cellular atrophy and hypertrophy are frequently observed as cells respond to a variety of exogenous stressors or pathological conditions. The elucidation of the biological basis of these cell size regulatory mechanisms, across a range of organs and disease states, continues to be a major thrust in biomedical research.

Currently, the vast majority of studies aiming to investigate cell size, in both animals and humans, rely on ex vivo microscopic analysis of perfused organs or tissue sections. While these efforts have made great strides in improving our understanding of cell size regulation and characteristics in disease states they are not suitable for in vivo or longitudinal applications and are often confounded by limited sampling volumes, as in the case of human biopsies. What is needed is a non-invasive imaging method to assess whole organ cell size heterogeneity, as it could provide a valuable tool, in both animals and humans, for tissue and disease characterization, mechanistic explorations, diagnostics and assessment of treatment response.

SUMMARY

The various embodiments of the present invention relate to magnetic resonance imaging (MRI), and more specifically to apparatus and methods for cell size imaging using MRI systems.

In a first embodiment, there is provided a method of evaluating biological tissues using magnetic resonance imaging (MRI). The method involves obtaining first MRI data for biological tissues of interest before introducing a contrast agent therein and obtaining second MRI data for the biological tissues after having the contrast agent introduced therein and during a period of time, at least a portion of the period of time corresponding to an equilibrium of the contrast agent between vessels and extravascular extracellular space. The method further involves calculating, from the first and the second MRI data, a ratio of a change in gradient echo relaxation time and a change in spin echo relaxation time corresponding to each of a plurality of locations in the biological tissues and characterizing a size of cells for at least one the plurality of locations based on the corresponding ratio.

In some configurations of the first embodiment, the characterizing includes computing the size of the cells in the at least one of the plurality of locations based on the corresponding ratio. Such computing can involve, based on a spin echo time and the corresponding ratio, extracting a characteristic correlation time, and ascertaining the size of the cells based on a pre-defined function relating the perturber size to the size of the cells. The extracting of the characteristic correlation time ($\tau_c$) can involve solving:

$$x = TE/\tau_c,$$

where TE is the spin echo time, and where x is obtained by solving:

$$\frac{\Delta R_2^*}{\Delta R_2} = \left(\frac{1}{\lambda}\right) \frac{e^{-x\cdot\lambda} - 1 + x\cdot\lambda}{4e^{-x/2} - e^{-x} + x - 3},$$

where $\Delta R_2^*/\Delta R_2$ is the corresponding ratio and $\lambda \cdot TE$ is the gradient echo time. The pre-defined function can be:

$$\tau_c = kR^2/6D$$

where R is the cell size, $\tau_c$ is the characteristic correlation time, D is the self-diffusion coefficient, and k is a scaling constant accounting for cellular volume fraction.

In other configurations of the first embodiment, the characterizing involves determining a relative difference in the size of the cells in two or more of the plurality of locations based on comparing the ratio corresponding to each of the two or more of the plurality of locations.

In other configurations of the first embodiment, the characterizing involves extracting a characteristic correlation time for two or more of the plurality of locations based on a spin echo time and the corresponding ratio, and determining a relative difference in the size of the cells in two or more of the plurality of locations based on comparing the characteristic correlation time for each of the two or more of the plurality of locations.

In a second embodiment of the present invention, there is provided a computer-readable storage device, have stored therein a computer program executable by a computer, the computer program including instructions for causing the computer to perform a method of evaluating biological tissues using magnetic resonance imaging (MRI). The method can be the method of the first embodiment.

In a third embodiment of the present invention, there is provided an apparatus including at least one processor and a storage device having stored therein a computer program, the computer program including instructions for causing the at least one processor to perform a method of evaluating biological tissues using magnetic resonance imaging (MRI). The method can be the method of first embodiment.

BRIEF DESCRIPTION OF THE DRAWINGS

FIGS. 2A, 2B, 2C, 2D, 2E, and 2F show the configuration of and results of computational modeling of a structure of vessels and cells;

DETAILED DESCRIPTION

Figure 1:
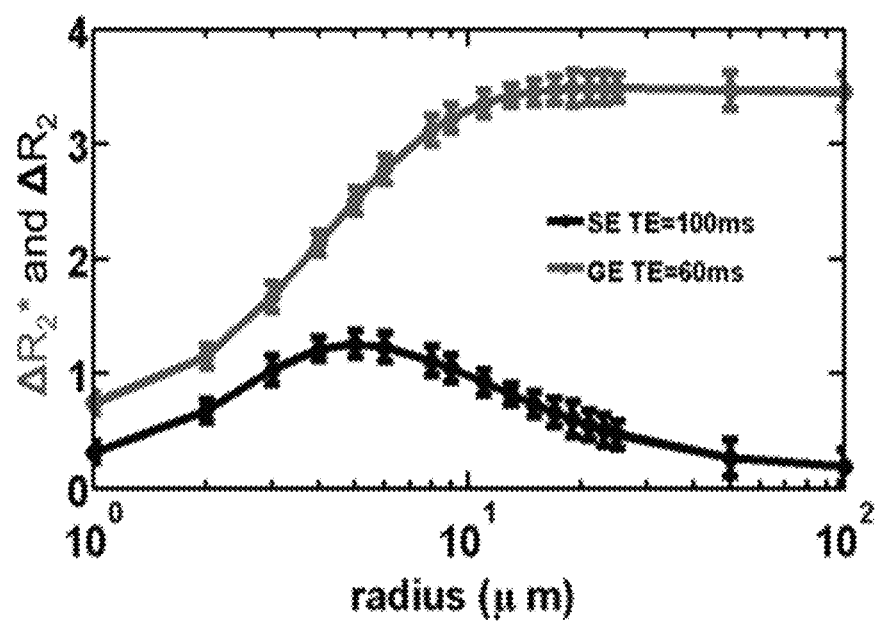
FIG. 1 shows a log-linear plot of perturber size versus $\Delta R_2^*$ (top curve) and $\Delta R_2$ (bottom curve)

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Dynamic contrast agent (CA) enhanced MRI methods have demonstrated the potential to interrogate many characteristics of tissue. These methods involve the serial acquisition of magnetic resonance (MR) images of a tissue of interest before and after an intravenous injection of a CA. After CA administration, the longitudinal ($T_1$) and transverse ($T_2$, and $T_2^*$) relaxation times of tissue water decrease to an extent that is determined by the CA concentration. Studies that exploit changes in $T_1$ are termed dynamic contrast enhanced (DCE) MRI, while those relying on $T_2$ and $T_2^*$ changes are termed DSC-MRI. By fitting these datasets to an appropriate pharmacokinetic model, physiological parameters can be extracted that relate, in general, to the rate of CA delivery as well as the tissue volume fractions (e.g. vascular, extracellular). In the context of the heart, contrast enhanced MRI is increasingly used to identify regions exhibiting late enhancement (LE), which is indicative of increased CA accumulation within an enlarged extracellular volume due to local fibrosis, inflammation and edemal. In liver, CA passage through tissue is typically divided into phases (arterial, portal venous, delayed enhancement) in order to more accurately visualize perfusion and interstitial distribution of the CA; parameters which provide improved characterization of lesions.

While the method of cell size imaging of the various embodiments has not previously been used or even suggested, the method relies upon the same biophysical basis as the advanced DSC-MRI technique termed Vessel Size Imaging (VSI), which has been validated and in use for over fifteen years. In general, when a CA is introduced into blood vessels it creates a susceptibility difference between the vessels and the surrounding tissue. The susceptibility difference generates magnetic field inhomogeneities surrounding the blood vessels leading to enhanced proton de-phasing in the extravascular space and a decrease in the transverse relaxation times. When susceptibility based contrast enhanced MRI data is acquired using a spin and gradient echo sequence, measures of mean vessel size within a voxel can be derived. The methods used for VSI rely upon the differential vessel-size sensitivity of gradient and spin echo data and is primarily used to characterize abnormal tumor blood vessels. Simulations and experimental data have shown, over a range of conditions consistent with vascular density and size, that the change in the gradient echo (GE) relaxation rate ($\Delta R_2^*$) initially increases for very small perturber sizes and then plateaus as perturber size increases. This is shown in FIG. 1, which there is shown a log-linear plot of perturber size versus $\Delta R_2^*$ (top curve) and $\Delta R_2$ (bottom curve). In contrast to $\Delta R_2^*$, the spin echo (SE) relaxation rate change ($\Delta R_2$) increases, peaks and then decreases, with a maximal sensitivity towards capillary sized perturbers. In the context of VSI, GE and SE data is considered to reflect vessels of all sizes and the microvasculature, respectively, and the ratio of $\Delta R_2^*$ and $\Delta R_2$ is a sensitive indicator of mean vessel size in a voxel.

However, magnetic field perturbers are not limited to blood vessels and can be any structure or substances that introduce regional magnetic field inhomogeneities within a voxel. Therefore, the magnitude of the measured $\Delta R_2^*$ and $\Delta R_2$ depends on the geometry of the perturber distribution. For example, if one looks at the influence of CA distributed within blood vessels and the extravascular extracellular space (EES) on GE relaxation rate changes, the perturber geometry within the voxel is defined by the distribution of CA around cells. (Note that clinically approved CAs cannot cross the cellular membrane and remain with the EES.) As a result, $\Delta R_2^*$ values, when acquired at contrast agent equilibrium between blood vessels and EES, are highly sensitive to cellular features including cell density, size and spatial distribution. Similarly, SE $\Delta R_2$ values also depend upon the underlying cellular cytoarchitecture. Combining these results, the inventors have discovered that gradient and spin echo susceptibility based contrast-enhanced MRI data, when acquired at CA equilibrium, exhibit unique sensitivities to cell size. Thus, when these values are combined, they can be used to compute a measure of mean cell size in a voxel. The changes in sensitivity are illustrated below with respect to FIGS. 2A-2F.

FIGS. 2A-2F show the configuration of and results of a computational study of a structure consisting of vessels and cells. FIG. 2A shows the 3D structure used for computational modeling. FIG. 2B shows Dynamic [CA] time curves for plasma ($C_p$) and the EES ($C_e$). FIG. 2C shows a 2D slice through the 3D structure of FIG. 2A. FIGS. 2D, 2E, and 2F show three magnetic field maps for the designated time points along the [CA] time curves for FIG. 2B.

The tissue structures of FIG. 2A consist of elliptical shaped cells tightly packed around vascular trees generated using fractal geometries (note that the ellipsoid size is magnified for visualization purposes). FIG. 2B shows simulated CA concentration time curves for blood plasma ($C_p$, red) and the EES ($C_e$, blue). To evaluate the sensitivity of the magnetic field perturbations to cellular structures the spatial properties at three time points along the dynamic CA time curves are considered (FIGS. 2D-2F). At time point #1 (FIG. 2D), which is during the early phase of the CA's first pass (where $C_p \gg C_e$) the magnetic field perturbations primarily surround the blood vessels in the 2D plane. Near the end of the first pass, at time point #2 (FIG. 2E, where $C_p > C_e$), the field perturbations are more complex, surrounding both vessels and cells. At CA equilibrium (FIG. 2F, $C_p = C_e$), the magnetic field perturbations that are strongest exhibit more heterogeneity around the cellular structures. Across a range of physiologic conditions, CA within blood vessels contributes minimally to the overall magnetic field heterogeneity when the CA is at equilibrium between the vascular and extravascular space. Accordingly, the predominant source of magnetic field heterogeneity at CA equilibrium is the presence and geometrical properties of the cells. It is this cell-specific magnetic field heterogeneity that serves as the basis of cell size imaging.

The method of the various embodiments is unique because it represents the first time susceptibility-based contrast enhanced MRI has been leveraged to determine cell size non-invasively. While traditional contrast enhanced MRI methods, such as DCE-MRI or DSC-MRI, enable the measurement of parameters relating to the rate of CA passage through tissue structures and the CA distribution volume fraction, the method of the various embodiments represents a significant technological shift as it aims to determine the mean cell size in a voxel, thereby providing a map of whole organ cell size heterogeneity. Currently, the only other potential non-invasive MRI based cell size imaging method utilizes advanced diffusion weighted imaging (DWI) sequences. Diffusion weighted imaging is an approach that is sensitive to the Brownian motion of water and, more specifically, its restriction in biological systems. Over the past decade models of water restriction in tissue have been developed in order to extract measures of axon size in the brain and spine as well as tumor cell size using DWI. One advantage of the DWI methods is that they do not rely upon the use of CAs or their distribution in tissue and are therefore better suited for applications in the brain where the blood brain barrier prevents the extravasation of the CA.

While promising, it is well recognized that the clinical translation of these advanced DWI methods is challenging as they rely on high gradient strengths that are not typically available on clinical MR systems. Given the enhanced sensitivity of the DWI methods to motion their application in organs influenced by cardiac or respiratory motion will likely be confounded further. These restrictions serve as even greater motivation for the proposed cell size imaging approach as it relies upon minor modifications of existing contrast enhanced scans already in use in the clinic and can be implemented in organs such as the heart and liver.

As described above much effort has been devoted to establishing the biophysical and theoretical basis of VSI. Initially, the ratio of $\Delta R_2^*$ and $\Delta R_2$ was used as a relative metric of vessel size but with improved theoretical development an approach was proposed that enabled vessel size to be quantified in absolute units. A common approach for modeling signal changes in GE data, such as that used in the quantitative VSI theory, is to assume that the CA introduces static magnetic field inhomogeneities that protons experience. In such cases, the influence of water diffusion can be neglected and is typically termed the static diphasic regime. For physiologic vascular geometries and susceptibility differences encountered during a VSI experiment the static dephasing regime has been shown to be reasonable and is responsible for the insensitivity of $\Delta R_2^*$ to perturber size above a certain limit as shown in FIG. 1.

With regards to the influence of cellular properties on $\Delta R_2^*$, at physiologic cell densities (>50% cell volume fraction) the perturber size where $\Delta R_2^*$ reaches a plateau substantially shifts to larger sizes (>20 microns). This has important implications for cell size imaging because it indicates that one cannot simply apply the same theory used for quantitative VSI since the static regime assumption is not valid across a wide range of typical cell sizes. Accordingly, the present disclosure now introduces a more general theoretical model for imaging perturber sizes that avoids this assumption.

It has been previously shown how the mean field theory developed by Anderson and Weiss may be used to model GE and SE MRI signals. The Anderson and Weiss theory predicts the effects of a randomly varying field on a spin's phase, assuming that the distribution of the spin phases in each voxel is Gaussian. For the method of the various embodiments, the randomly varying field arises from the diffusion of water molecules through the magnetic field inhomogeneities generated by the distribution of a contrast agent within a voxel. The frequency changes that arise from these field fluctuations and experienced by the spin can be described by a correlation function with a characteristic correlation time ($\tau_c$). Thus, based on GE and SE signal equations, the corresponding $\Delta R_2^*$ and $\Delta R_2$ can be expressed as shown in Eq. 1, $$\Delta R_2^* \cdot \lambda \cdot TE = \langle \Delta \omega_o^2 \rangle \tau_c^2 [4e^{-x/2} - e^{-x} + x - 3] \quad (1)$$

$$\Delta R_2 \cdot TE = \langle \Delta \omega_o^2 \rangle \tau_c^2 [e^{-x} - 1 + x]$$

where $x = TE/\tau_c$ where $\langle \Delta \omega_0^2 \rangle$ is the mean square frequency deviation from $\omega_0$ and TE is the spin echo time and $\lambda \cdot TE$ is the gradient echo time. As in VSI, one can take the ratio of $\Delta R_2^*$ and $\Delta R_2$ which leads to the expression shown in Eq. 2.

$$\frac{\Delta R_2^*}{\Delta R_2} = \left(\frac{1}{\lambda}\right) \frac{e^{-x \cdot \lambda} - 1 + x \cdot \lambda}{4e^{-x/2} - e^{-x} + x - 3} \quad (2)$$

In order to relate the ratio in Eq. 2 to a perturber size, $\tau^c$ can be defined in terms of the characteristic distance over which the magnetic field changes. A conventional approach, which is also used in VSI, is to designate this distance as being equal to the radius of the field perturbers, $\tau_c = R^2/6D$, where R is the perturber radius and D is the self-diffusion coefficient for water molecules.

Figure 3:
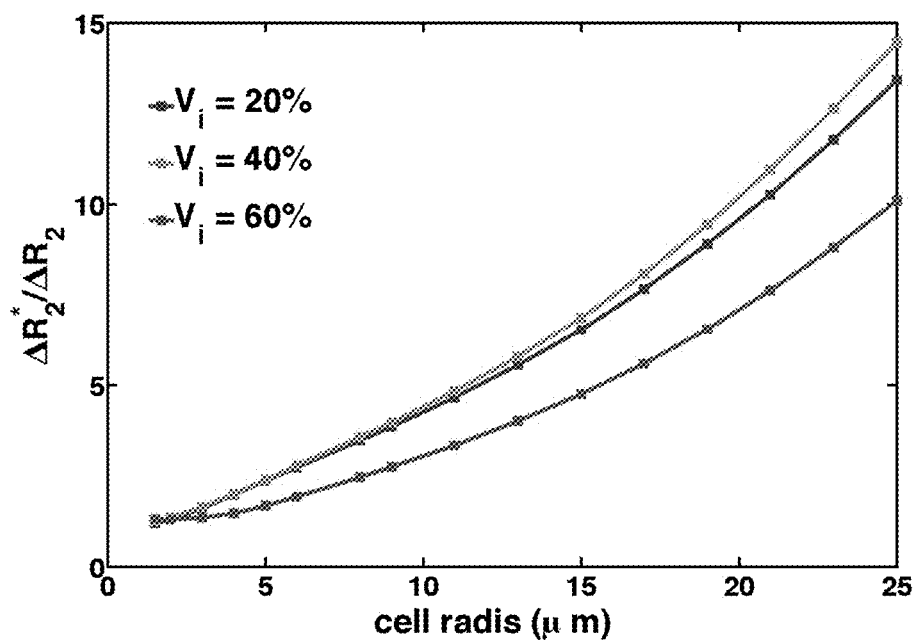
FIG. 3 is an X-Y plot of the $\Delta R_2^*/\Delta R2$ ratio versus cell radius.

FIG. 3 is an X-Y plot of cell radius as a function of the ratio $\Delta R_2^*/\Delta R_2$. FIG. 3 shows that, as with VSI, $\Delta R_2^*/\Delta R_2$ increases with cell size. This indicates that the ratio itself may be used as a relative measure of cell size. For example, the ratio would be expected to increase under conditions of cellular hypertrophy, as compared to normal physiological states. Clinically, this approach would be the easiest to implement as it would only require the acquisition of multi-echo $T_2$ and $T_2^*$ weighted images in order to measure the change in $R_2^*$ and $R_2$ before and after CA injection. This can be achieved with a simultaneous GE and SE pulse sequence but could also be acquired using standard GE and SE sequences acquired sequentially. Since this approach relies upon measures of $\Delta R_2^*$ and $\Delta R_2$ at CA equilibrium rapid imaging techniques, such as the echo planar imaging methods used for DSC-MRI, are not necessarily required, thereby enabling the use of conventional imaging sequences that are currently optimized for use in specific organs, like the heart or liver. For quantitative measures of cell size, multi-echo $\Delta R_2^*$ and $\Delta R_2$ can be acquired and used with Eq. 2 (with an assumed or measured D value) to compute the cell radius (R).

Figure 4:
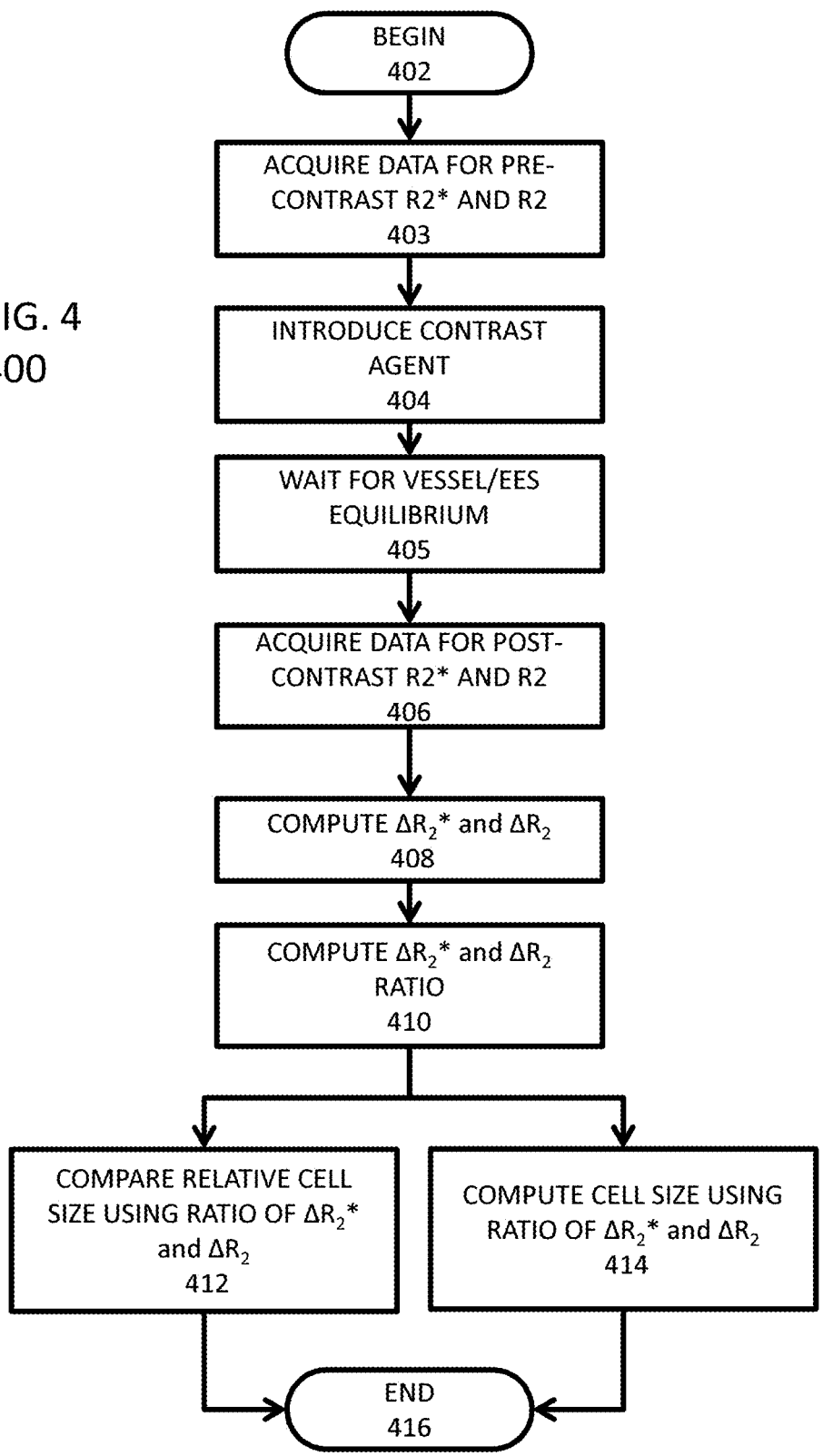
FIG. 4 is a flowchart of steps of an exemplary method 400 for cell size imaging in accordance with the various embodiments.

Turning now to FIG. 4, there is shown a flowchart of steps of an exemplary method 400 for cell size imaging in accordance with the various embodiments. The method begins at step 402 and continues on to step 403. At step 403, MRI acquisition for the biological tissues of interest is performed without any contrast agent. At step 404, CA is introduced into the biological tissues of interest. For example, by injecting a subject with CA. Thereafter, at step 406, a post-contrast MRI acquisition for the biological tissues of interest is begun.

As discussed above, MRI acquisition (including MRI acquisition at steps 403 and 406) can involve, in some embodiments, generating GE and SE pulse sequences in order to acquire multi-echo $T_2$ and $T_2^*$ weighted images after the CA is introduced. However, any other techniques for generating data that can be used to derive or compute $R_2^*$ and $R_2$, and eventually $\Delta R_2^*$ and $\Delta R_2$ can be used in the various embodiments.

In general, the amount of time required for MRI data acquisition associated with cell size can vary according to cell/organ type, blood vessel characteristics, CA characteristics, and other factors. Thus, in some embodiments, the MRI data can be acquired immediately upon introduction of CA. In such a configuration, the acquired MRI data can be used to obtain MRI data for blood vessel size initially and MRI data for cell size later. That is, as shown in FIG. 2, the MRI data will transition from being highly sensitive to blood vessel structures to being highly sensitive to cell structures. In general, the transition can take several minutes. In other embodiments, the acquisition of MRI data can be delayed until a time associated with CA equilibrium between blood vessels and EES. This can be a few minutes after the CA is introduced. The actual amount of time can, if necessary, be estimated from simulations. However, the present inventors have found that 2-5 minutes can be sufficient. Further, as CA will generally remain in a state associated with CA equilibrium between blood vessels and EES for an extended amount of time (~10-20 minutes), a 5 minute delay will not generally affect the results. Accordingly, in some embodiments, a delay or wait step 405, to wait for CA equilibrium between blood vessels and EES, can be provided prior to step 406

Once the MRI data is acquired at step 406, the method can proceed to step 408 to compute $\Delta R_2^*$ and $\Delta R_2$ values. Thereafter, at step 410, the ratio of $\Delta R_2^*$ and $\Delta R_2$ can be obtained. In some embodiments, method can proceed to step 412 to do a relative comparison of cell size, where the ratio of $\Delta R_2^*$ and $\Delta R_2$ can be used as a comparison measure to determine a relative cell size. Alternatively, Eq. 1 and Eq. 2 can be used to compute $\tau_c$, can be also used as a comparison measure to determine a relative cell size. In other embodiments, the method can proceed to step 414, where the ratio of $\Delta R_2^*$ and $\Delta R_2$ can be used directly to determine cell size. For example, Eq. 2 and the relationship $\tau_c = R^2/6$ D can be used to compute cell size. After either of steps 412 or 414, the method ends at step 416.

In some cases, cellular volume fraction can potentially affect MRI acquisition, as well as the computation of $\Delta R_2^*$ and $\Delta R_2$. This is illustrated in FIG. 3, where each of the curves shown therein corresponds to a different cellular volume fraction. Therefore, in some embodiments, a scaling factor can be introduced to account for cellular volume fraction. Thus $\tau_c = kR^2/6$ D. To account for this scaling factor, a table of scaling factors over a range of physiologic cellular volume fractions ($v_c$) can be utilized. Additionally or alternative, the acquisition can be modified so that a measurement of $v_c$ is obtained. In particular, to measure $v_c$, one would need to either 1) do a separate DCE-MRI study using existing methods (prior to the acquisition of steady state measures of $\Delta R_2^*$ and $\Delta R_2$ at step 406); or. 2) extract the DCE-MRI data from "dynamic" multi-echo $R_2^*$ and $R_2$ weighted signal acquisitions (i.e., the same acquisition method and data used for cell size imaging). That is, the data is acquired (dynamically) before, during and after the contrast injection. With this data one would extract the DCE-MRI signal and the $v_c$ term. One could then use $v_c$ in the equations with the measured $\Delta R_2^*$ and $\Delta R_2$. However, the invention is not limited in this regard and other methods for obtaining $v_c$ can be used in the various embodiments.

EXAMPLES

The following examples and results are presented solely for illustrating the various embodiments and are not intended to limit the various embodiments in any way.

For a preliminary evaluation of the proposed approach of the various embodiments, the relative term, the Cell Size Index (CSI), was computed as the ratio of $\Delta R2^*$ and $\Delta R2$ obtained from MRI scans of rat brain tumors. For this example, the evaluation relied upon a GE/SE DSC-MRI pulse sequence. In general, cell size imaging can be incorporated into DCE-MRI scans or even steady state post-contrast imaging, enabling this approach to be applied in tissues throughout the body.

For in vivo characterization, CSI in 9 L (n=12) and C6 (n=11) brain tumors was evaluated and quantified cell size using histology.

As previously discussed, FIG. 3 illustrates the relationship between $\Delta R_2^*/\Delta R_2$ and cell size, as determined by simulation. Over a reasonable biological range, $\Delta R_2^*/\Delta R_2$ increases with cell radius. Histologically, 9 L and C6 tumors were found to be 8.4±1.7 µm and 5.02±0.6 µm, respectively; yielding a cell size ratio between the tumor types of 1.67. With a 60% volume fraction and using the cell sizes determined by histology, the simulated CSI ratio between the tumor types was 1.65, in agreement with the histological results.

Figure 5A:
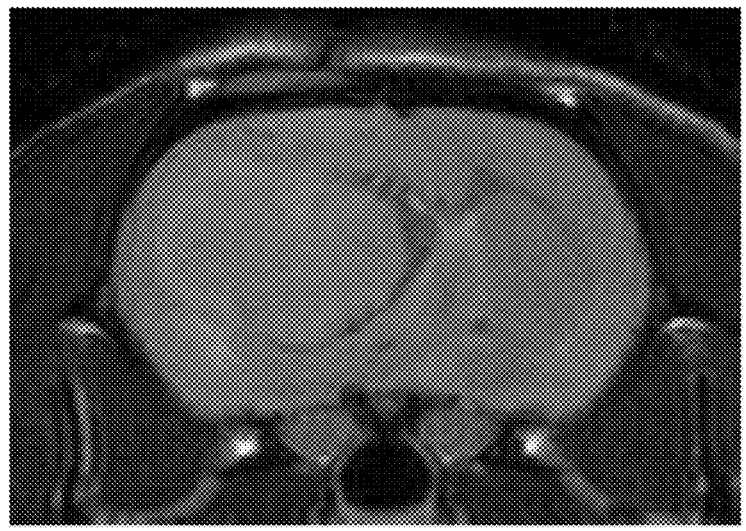
FIGS. 5A and 5B show an example anatomic image and cell size map of a 9 L brain tumor obtained accord to an embodiment of the invention, respectively.
Figure 5B:
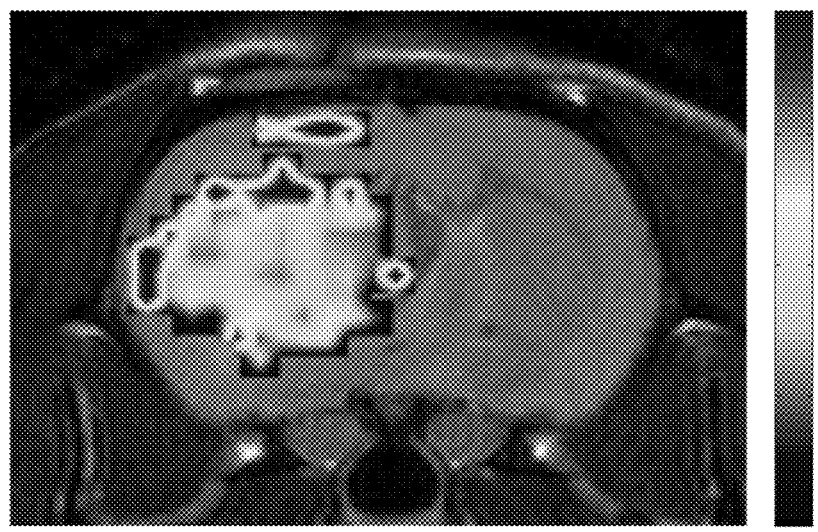

FIG. 5A illustrates an example anatomic image and FIG. 5B illustrates a CSI map of a 9 L brain tumor obtained according to the method of the various embodiments. The CSI values were significantly higher (p=7.2×10$^{-6}$) in 9 L tumors (1.7±0.2) than in C6 tumors (1.2±0.2). Since, at this preliminary stage of development, CSI is a relative measure of cell size the ratio of 9 L and C6 CSI values was compared to the ratio of histologically determined values. The ratio of mean 9 L and C6 CSI values across all rats was 1.4, which is only 16% less than that found via histology.

This study indicates that contrast enhanced MRI can be used to assess relative cell size. Simulations and in vivo data indicate that the ratio of $\Delta R_2^*$ and $\Delta R_2$, when computed at CA equilibrium, is sensitive to cell size. Proportionally, in vivo CSI values were reasonably close to histological estimates of cellular size, which is encouraging given the complex and heterogeneous nature of cellular packing and the potential for a range of cell sizes to exist within a voxel.

Figure 6:
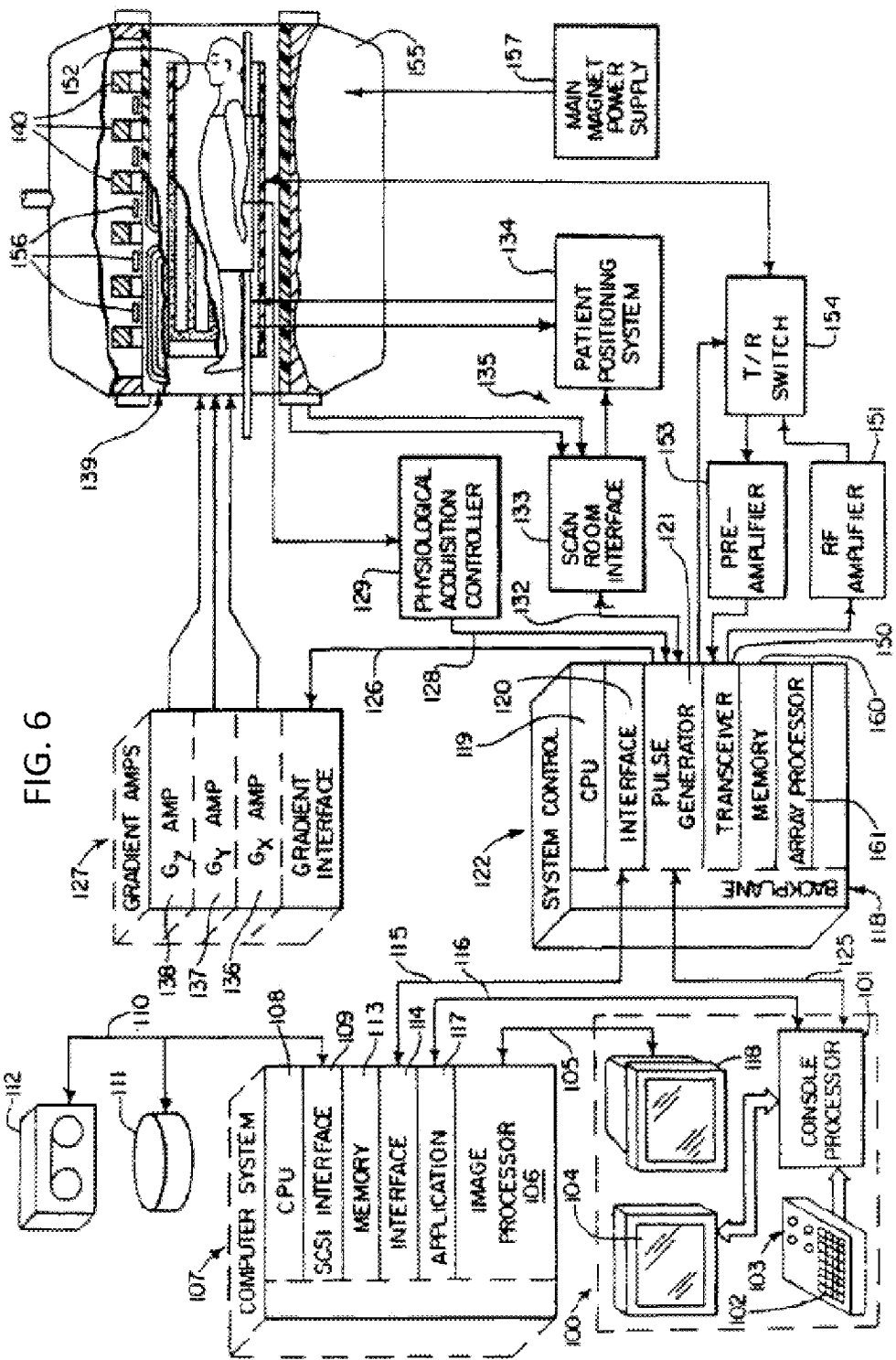
FIG. 6 is a block diagram of an MRI system used to acquire NMR data according to the various embodiments of the invention.

Referring no to FIG. 6, there is shown the major components of an exemplary NMR system which can be used to carry out the methods of the various embodiments. It should be noted that the methods of the various can also be carried out using other NMR systems, including systems with more or less components than shown in FIG. 5.

The operation of the system of FIG. 6 is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$, and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 155 which includes a polarizing magnet 140 that produces a 1.5 Tesla polarizing field that extends horizontally through a bore. The gradient coils 139 encircle the bore, and when energized, they generate magnetic fields In the same direction as the main polarizing magnetic field, but with gradients $G_x$, $G_y$, and $G_z$ directed in the orthogonal x-, y- and z-axis directions of a Cartesian coordinate system. That is, if the magnetic field generated by the main magnet 140 is directed in the z direction and is termed BO, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_o + G_x x + G_y y G_z z$. The gradient magnetic fields are utilized to encode spatial information into the NMR signals emanating from the patient being scanned. Because the gradient fields are switched at a very high speed when an EPI sequence is used to practice the preferred embodiment of the invention, local gradient coils are employed in place of the whole-body gradient coils 139. These local gradient coils are designed for the head and are in close proximity thereto. This enables the inductance of the local gradient coils to be reduced and the gradient switching rates increased as required for the EPI pulse sequence. For a description of these local gradient coils which is incorporated herein by reference, see U.S. Pat. No. 5,372,137 issued on Dec. 13, 1994 and entitled "NMR Local Coil For Brain Imaging".

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150.

The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate local RF head coil to be used in the transmit and receive mode to improve the signal-to-noise ratio of the received NMR signals. With currently available NMR systems such a local RF coil is preferred in order to detect small variations in NMR signal. Reference is made to the above cited U.S. Pat. No. 5,372,137 for a description of the preferred local RF coil.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118 as will be described in more detail hereinafter.

Figure 7:
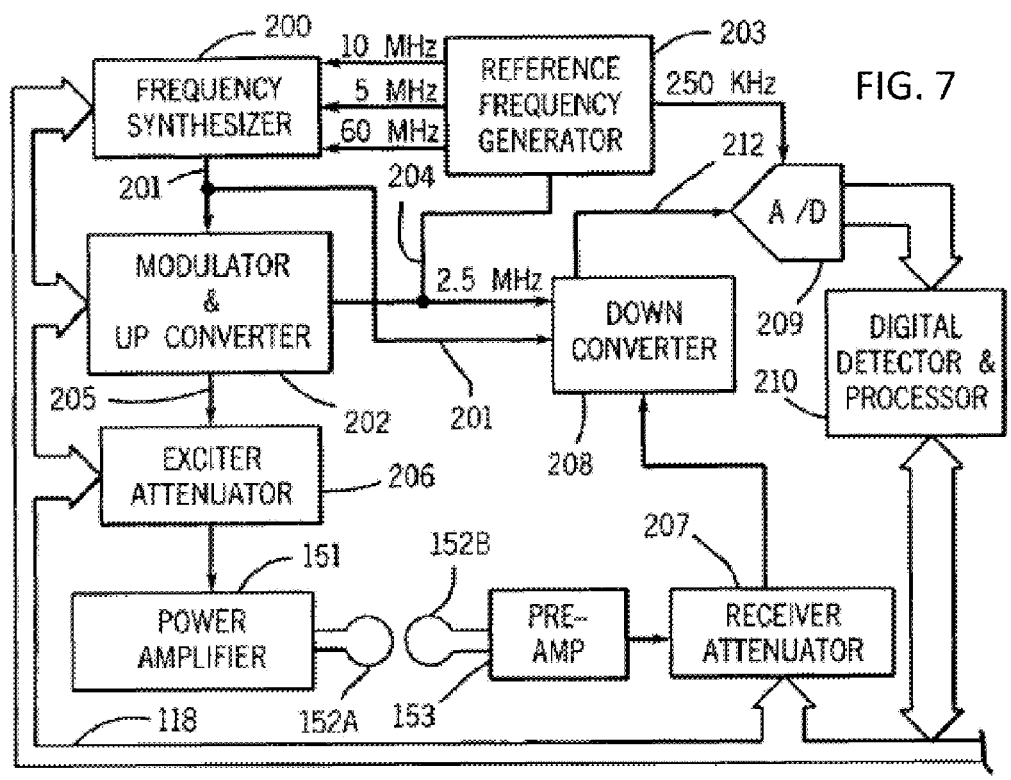
FIG. 7 is a block diagram of a transceiver which forms part of the MRI system of FIG. 6.

Referring particularly to FIGS. 6 and 7, the transceiver 150 includes components which produce the RF excitation field B1 through power amplifier 151 at a coil 152A and components which receive the resulting NMR signal induced in a coil 152B. As indicated above, the coils 152A and B may be a single whole-body coil, but the best results are achieved with a single local RF coil specially designed for the head. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205. The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 6 and 7 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation. The received NMR signal is at or around the Larmor frequency, which in the preferred embodiment is around 63.86 MHz for 1.5 Tesla. This high frequency signal is down converted in a two-step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Also, the terms "about", "substantially", and "approximately", as used herein with respect to a stated value or a property, are intend to indicate being within 20% of the stated value or property, unless otherwise specified above. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of evaluating biological tissues using magnetic resonance imaging (MRI), comprising:
   obtaining first MRI data for biological tissues of interest before introducing a contrast agent therein;
   obtaining second MRI data for the biological tissues after having the contrast agent introduced therein and during a period of time, at least a portion of the period of time corresponding to an equilibrium of the contrast agent between vessels and extravascular extracellular space;
   calculating, from the first and the second MRI data, a ratio of a change in gradient echo relaxation time and a change in spin echo relaxation time corresponding to each of a plurality of locations in the biological tissues;
   characterizing a size of cells for at least one the plurality of locations based on the corresponding ratio.

2. The method of claim 1, wherein the characterizing comprises:
   computing the size of the cells in the at least one of the plurality of locations based on the corresponding ratio.

3. The method of claim 2, wherein the computing comprises:
   based on a spin echo time and the corresponding ratio, extracting a characteristic correlation time; and
   ascertaining the size of the cells based on a pre-defined function relating the characteristic correlation time to the size of the cells.

4. The method of claim 3, where extracting the characteristic correlation time ($\tau_c$) comprises solving:

$$x = TE/\tau_c,$$

where TE is the spin echo time, and where x is obtained by solving:

$$\frac{\Delta R_2^*}{\Delta R_2} = \left(\frac{1}{\lambda}\right)\frac{e^{-x\lambda} - 1 + x\cdot\lambda}{4e^{-x/2} - e^{-x} + x - 3},$$

where $\Delta R_2^*/\Delta R_2$ is the corresponding ratio and $\lambda\cdot TE$ is the gradient echo time.

5. The method of claim 3, wherein the pre-defined function comprises:

$$\tau_c = kR^2/6D$$

where R is the cell size, $\tau_c$ is the characteristic correlation time, D is the self-diffusion coefficient, and k is a scaling constant accounting for cellular volume fraction.

6. The method of claim 1, wherein the characterizing comprises:
   determining a relative difference in the size of the cells in two or more of the plurality of locations based on comparing the ratio corresponding to each of the two or more of the plurality of locations.

7. The method of claim 1, wherein the characterizing comprises:
   based on a spin echo time and the corresponding ratio, extracting a characteristic correlation time for two or more of the plurality of locations; and
   determining a relative difference in the size of the cells in two or more of the plurality of locations based on comparing the characteristic correlation time for each of the two or more of the plurality of locations.

8. A computer-readable storage device, have stored therein a computer program executable by a computer, the computer program comprising instructions for causing the computer to perform a method of evaluating biological tissues using magnetic resonance imaging (MRI), comprising:
   obtaining first MRI data for biological tissues of interest before introducing a contrast agent therein;
   obtaining second MRI data for the biological tissues after having the contrast agent introduced therein and during for a period of time, at least a portion of the period of time corresponding to an equilibrium of the contrast agent between vessels and extravascular extracellular space;
   calculating, from the first and the second MRI data, a ratio of a change in gradient echo relaxation time and a change in spin echo relaxation time corresponding to each of a plurality of locations in the biological tissues;
   characterizing a size of cells for at least one the plurality of locations based on the corresponding ratio.

9. The computer-readable storage device of claim 8, wherein the characterizing comprises:
   computing the size of the cells in the at least one of the plurality of locations based on the corresponding ratio.

10. The computer-readable storage device of claim 9, wherein the computing comprises:
   based on a spin echo time and the corresponding ratio, extracting a characteristic correlation time; and
   ascertaining the size of the cells based on a pre-defined function relating the characteristic correlation time to the size of the cells.

11. The computer-readable storage device of claim 10, where extracting the characteristic correlation time ($\tau_c$) comprises solving:

$$x = TE/\tau_c,$$

where TE is the spin echo time, and where x is obtained by solving:

$$\frac{\Delta R_2^*}{\Delta R_2} = \left(\frac{1}{\lambda}\right)\frac{e^{-x\lambda} - 1 + x\cdot\lambda}{4e^{-x/2} - e^{-x} + x - 3},$$

where $\Delta R_2^*/\Delta R_2$ is the corresponding ratio and $\lambda\cdot TE$ is the gradient echo time.

12. The computer-readable storage device of claim 10, wherein the pre-defined function comprises:

$$\tau_c = kR^2/6D$$

where R is the cell size, $\tau_c$ is the characteristic correlation time, D is the self-diffusion coefficient, and k is a scaling constant accounting for cellular volume fraction.

13. The computer-readable storage device of claim 8, wherein the characterizing comprises:
   determining a relative difference in the size of the cells in two or more of the plurality of locations based on comparing the ratio corresponding to each of the two or more of the plurality of locations.

14. The computer-readable storage device of claim 8, wherein the characterizing comprises:
   based on a spin echo time and the corresponding ratio, extracting a characteristic correlation time for two or more of the plurality of locations; and
   determining a relative difference in the size of the cells in two or more of the plurality of locations based on comparing the characteristic correlation time for each of the two or more of the plurality of locations.

15. An apparatus, comprising:
at least one processor; and
a storage device having stored therein a computer program, the computer program comprising instructions for causing the at least one processor to perform a method of evaluating biological tissues using magnetic resonance imaging (MRI), comprising:
obtaining first MRI data for biological tissues of interest before introducing a contrast agent therein;
obtaining second MRI data for the biological tissues after having the contrast agent introduced therein and during for a period of time, at least a portion of the period of time corresponding to an equilibrium of the contrast agent between vessels and extravascular extracellular space;
calculating, from the first and the second MRI data, a ratio of a change in gradient echo relaxation time and a change in spin echo relaxation time corresponding to each of a plurality of locations in the biological tissues;
characterizing a size of cells for at least one the plurality of locations based on the corresponding ratio.

16. The apparatus of claim 15, wherein the characterizing comprises:
computing the size of the cells in the at least one of the plurality of locations based on the corresponding ratio.

17. The apparatus of claim 16, wherein the computing comprises:
based on a spin echo time and the corresponding ratio, extracting a characteristic correlation time; and
ascertaining the size of the cells based on a pre-defined function relating the perturber size to the size of the cells.

18. The apparatus of claim 17, where extracting the characteristic correlation time ($\tau_c$) comprises solving:

$$x = TE/\tau_c,$$

where TE is the spin echo time, and where x is obtained by solving:

$$\frac{\Delta R_2^*}{\Delta R_2} = \left(\frac{1}{\lambda}\right)\frac{e^{-x\cdot\lambda} - 1 + x\cdot\lambda}{4e^{-x/2} - e^{-x} + x - 3},$$

where $\Delta R_2^*/\Delta R_2$ is the corresponding ratio and $\lambda\cdot TE$ is the gradient echo time.

19. The apparatus of claim 17, wherein the pre-defined function comprises:

$$\tau_c = kR^2/6D$$

where R is the cell size, $\tau_c$ is the characteristic correlation time, D is the self-diffusion coefficient, and k is a scaling constant accounting for cellular volume fraction.

20. The apparatus of claim 16, wherein the characterizing comprises:
determining a relative difference in the size of the cells in two or more of the plurality of locations based on comparing the ratio corresponding to each of the two or more of the plurality of locations.

21. The apparatus of claim 16, wherein the characterizing comprises:
based on a spin echo time and the corresponding ratio, extracting a characteristic correlation time for two or more of the plurality of locations; and
determining a relative difference in the size of the cells in two or more of the plurality of locations based on comparing the characteristic correlation time for each of the two or more of the plurality of locations.

* * * * *

UNITED STATES PATENT AND TRADEMARK OFFICE
CERTIFICATE OF CORRECTION

PATENT NO. : 9,747,490 B2
APPLICATION NO. : 14/932386
DATED : August 29, 2017
INVENTOR(S) : Quarles et al.

Page 1 of 1

It is certified that error appears in the above-identified patent and that said Letters Patent is hereby corrected as shown below:

In the Specification

In Column 1, after the section entitled GOVERNMENT LICENSE RIGHTS, Lines 5-8 should be replaced with the following:
--This invention was made with government support under grant number CA158079 awarded by the National Institutes of Health. The government has certain rights in the invention.--

Signed and Sealed this
Third Day of December, 2019

Andrei Iancu
*Director of the United States Patent and Trademark Office*